(12) United States Patent  
Baskaran (10) Patent No.: US 8,928,133 B2
(45) Date of Patent: Jan. 6, 2015

(54) INTERLOCKING TYPE SOLDER CONNECTIONS FOR ALIGNMENT AND BONDING OF WAFERS AND/OR SUBSTRATES

(75) Inventor: Rajesh Baskaran, Nashua, NH (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 155 days.

(21) Appl. No.: 13/465,226

(22) Filed: May 7, 2012

(65) Prior Publication Data

US 2013/0292037 A1 Nov. 7, 2013

(51) Int. Cl.
*H01L 29/72* (2006.01)
(52) U.S. Cl.
USPC ........... 257/686; 257/786; 156/91; 178/18.03

(58) Field of Classification Search
USPC ................... 257/686, 786; 156/91; 178/18.03
See application file for complete search history.

(56) References Cited

U.S. PATENT DOCUMENTS

| 4,966,446 A | * | 10/1990 | Huang et al. | 359/851 |
| 2008/0142943 A1 | * | 6/2008 | Kim et al. | 257/686 |
| 2009/0020342 A1 | * | 1/2009 | Oleskevich et al. | 178/18.03 |

* cited by examiner

*Primary Examiner* — Edward Wojciechowicz
(74) *Attorney, Agent, or Firm* — Christopher P. Maiorana, PC (57) ABSTRACT

An apparatus comprising a first substrate and a second substrate. The first substrate has disposed thereon a first feature. The second substrate has disposed thereon a second feature. The first feature is configured to interlock with the second feature such that the first substrate and the second substrate are aligned by the first and the second features within a predefined accuracy.

20 Claims, 7 Drawing Sheets

SECTION A-A (b)

INTERLOCKING TYPE SOLDER CONNECTIONS FOR ALIGNMENT AND BONDING OF WAFERS AND/OR SUBSTRATES

FIELD OF THE INVENTION

The present invention relates to integrated circuit fabrication generally and, more particularly, to a method and/or apparatus for implementing interlocking type solder connections for alignment and bonding of wafers and/or substrates.

BACKGROUND OF THE INVENTION

In many cases, bonding of one or more dies on a substrate or bonding of several stacks of substrates are required. Aligning and bonding the die/substrate/frames can be difficult. Bonding two die/wafers/substrates, one on top of another, requires a exceptionally high degree of alignment (often +/−one micron) and involves the use of expensive machines.

It would be desirable to implement an interlocking type solder connections for alignment and bonding of wafers and/or substrates, in order to avoid using expensive/elaborate alignment tools.

SUMMARY OF THE INVENTION

The present invention concerns an apparatus comprising a first substrate and a second substrate. The first substrate has disposed thereon a first feature. The second substrate has disposed thereon a second feature. The first feature is configured to interlock with the second feature such that the first substrate and the second substrate are aligned by the first and the second features within a predefined accuracy.

The objects, features and advantages of the present invention include providing a method and/or apparatus for implementing interlocking type solder connections for alignment and bonding of wafers and/or substrates that may (i) provide complementary features on wafers and/or substrates that facilitate self alignment, (ii) provide complementary features on wafers and/or substrates that may be used to form mechanical bonds, (iii) provide complementary features on wafers and/or substrates that may be used to form electrical connections, (iv) provide complementary features on wafers and/or substrates that may be used to form hermetically sealed cavities, and/or (v) provide complementary features on wafers and/or substrates that may be fabricated using existing techniques.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a simple approach to aligning and/or bonding two or more die, wafers, and/or substrates using an interlocking type solder connections. The approaches provided in accordance with embodiments of the present invention generally avoid the use of expensive and/or elaborate alignment tools.

Figure 1:
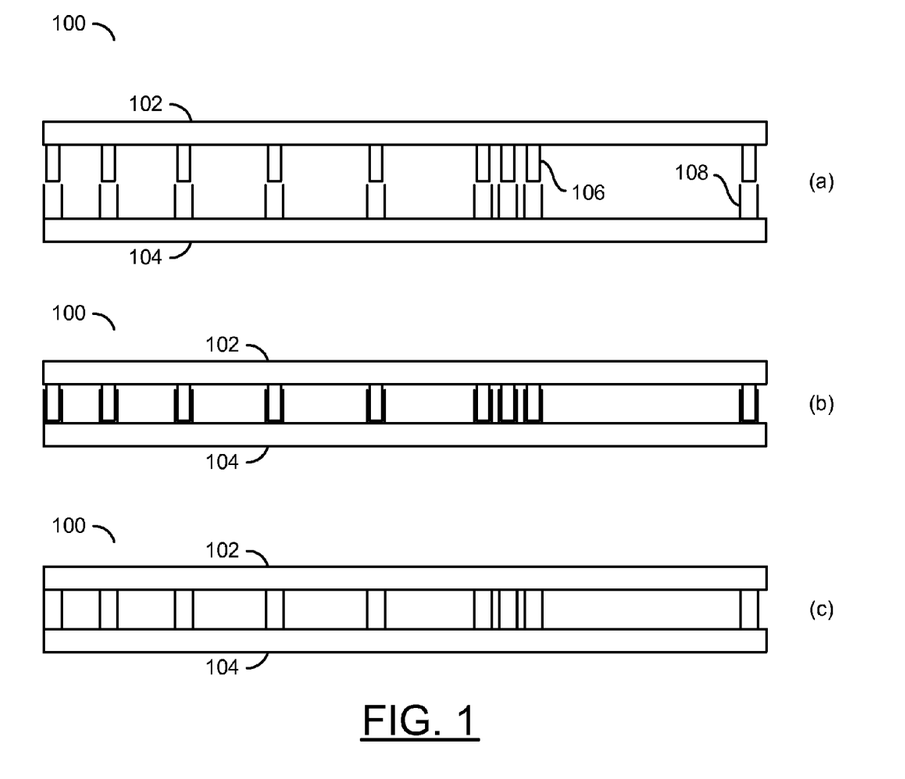
FIG. 1 is a diagram illustrating a side view of two substrates being aligned and bonded in accordance with an example embodiment of the present invention.

Referring to FIG. 1, a block diagram is shown illustrating a side view 100 of two substrates 102 and 104 being aligned and bonded in accordance with an example embodiment of the present invention. In complex radio frequency (RF), millimeter wave, and microwave circuits, signal and ground lines need to be transmitted from one substrate to another with no, or minimal, loss of signal integrity. The challenge in stacking and assembling various dies and or substrates is to properly maintain alignment during bonding of the parts. In one example, a male interlocking type structure or feature 106 (e.g., a solid pillar) may be fabricated on one of the parts (e.g., the substrate 102), and a counterpart female interlocking type structure or feature 108 (e.g., a hollow cylinder) of appropriate dimensions may be constructed on the other part (e.g., the substrate 104). The substrates 102 and 104 may comprise one or more of semiconductor dies, wafers, glass substrates, modules, pre-forms, and/or circuit boards. In one example, the features 106 and 108 may be created using lithographically defined patterns, and then built by using electro-deposition of a solder alloy. However, other solder deposition techniques may be applied to meet the design criteria of a particular implementation.

Once the structures 106 and 108 are constructed, the parts 102 and 104 may be more easily aligned, and bonded, as the solid solder pillar 106 fits into the hollow solder pillar 108. The structures 106 and 108 generally provide a way to align structures located elsewhere on the substrates 102 and 104. The structures 106 and 108 also may provide a way to temporarily bind the two parts 102 and 104 together while the assembly is then transferred to a bonding system/station to complete the bonding operation. With solder bonding for example, a solder reflow operation may provide a bridging gap to lateral dimensions of the features, and provide an extra volumetric space to capture any excess solder from compression of the two or more parts.

Figure 2:
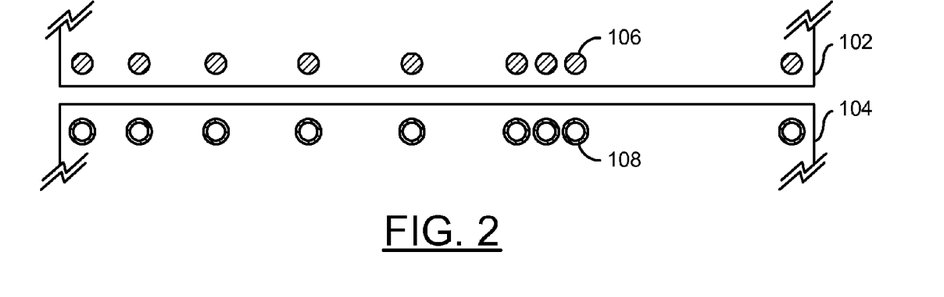
FIG. 2 is a diagram illustrating a plan view of respective features used to align and bond the two substrates in FIG. 1.

Referring to FIG. 2, a diagram is shown illustrating a plan view of respective features 106 and 108 used to align and bond the two substrates 102 and 104 in FIG. 1. In one example, the features 106 may be implemented as solid pillars on the substrate 102 and the features 108 may be implemented as hollow pillars on the substrate 104. The solid pillars 106 are sized to fit within the hollow pillars 108. The features 106 and 108 may be solder coated such that a bonded (e.g., reflowed solder) wafer formed by joining the substrates 102 and 104 has good alignment, and any gaps between the solid pillars 106 and the hollow pillars 108 is filled with molten solder during the reflow. A slight pressure may be applied to the two substrates 102 and 104 to assure a good bond is formed and any gaps between the solid pillars 106 and the hollow pillars 108 are filled by the molten solder.

In one example, the solder may be graded along the depth of the features 106 and 108 for structural integrity. The metallization may involve non-melting metal stacks and melting solders only at the mating features (e.g., to facilitate alignment and fit and to minimize overfilling). Although the features 106 and 108 are shown as round pillars and cylinders, respectively, any appropriate male structure (e.g., rectangular, cylindrical, square, spherical, etc.) may be implemented with a counterpart female structure that may be brought together to provide a reasonable fit before the application of heat to the solder/metal features, resulting in a soldered joint that has an aligned bond/fit.

Figure 3:
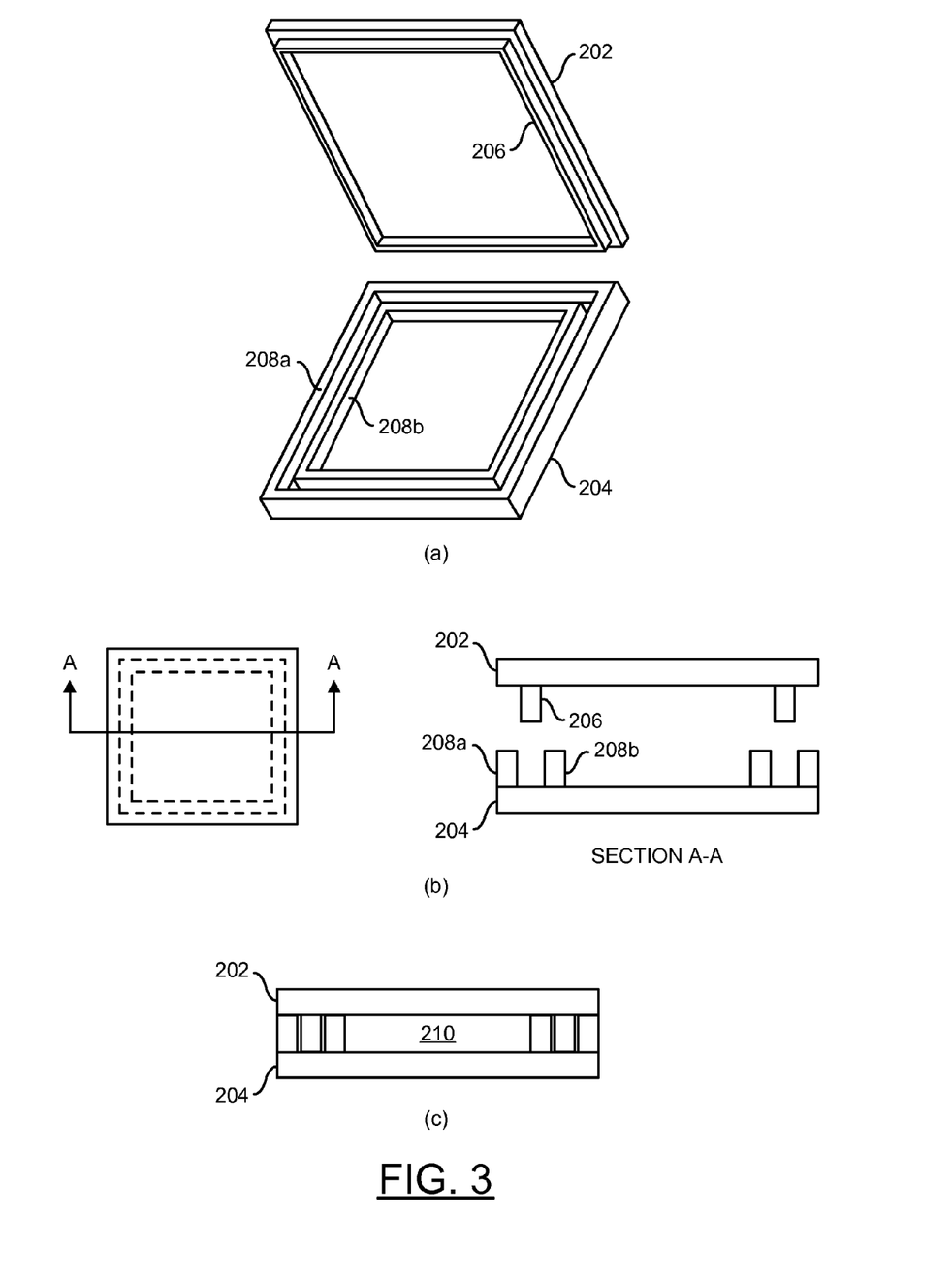
FIG. 3 is a diagram illustrating features forming an enclosed cavity in accordance with an example embodiment of the present invention.

Referring to FIG. 3, a diagram is shown illustrating features forming an enclosed cavity in accordance with an example embodiment of the present invention. The same technique described above in connection with FIGS. 1 and 2 may be used for hermetically sealing two surfaces 202 and 204 to form a gap (or cavity) between them. One or more standoffs 206, 208a, 208b, etc. may be constructed to keep the two surfaces from collapsing onto each other during assembly. The gap between the two surfaces 202 and 204 may also provide space for devices (e.g., surface mount device (SMDs), etc.) attached to one or both of the two surfaces 202 and 204. In addition, solder may be applied on the tips of the metal standoffs (or side/curved surfaces) providing a rigid structural member and ensuring that a cavity 210 formed during assembly is maintained in a hermetically sealed condition. Additional masks/layers may be implemented in some cases. In one example, Electroless Ni followed by alternating layers of Electroless Au/Sn plating may be performed to enable a maskless approach on Cu pillars/studs to form the seal. However, other materials may be used accordingly to meet the design criteria of a particular implementation.

Figure 4:
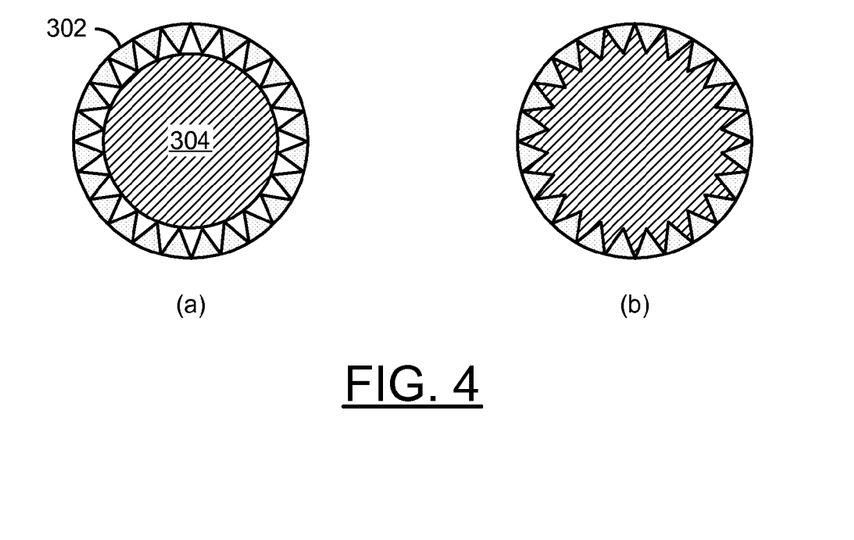
FIG. 4 is a diagram illustrating a serrated spline feature in accordance with another example embodiment of the present invention.

Referring to FIG. 4, a diagram is shown illustrating a feature 300 in accordance with another example embodiment of the present invention. In another example, an interference fit between two features may be implemented. In one example, a cylindrical structure with teeth 302 and a solid pillar 304 may be implemented. The teeth may be implemented in the solid pillar structure 304 instead of the cylindrical feature 302. In one example, the teeth may be implemented as a serrated spline. The teeth may be configured to allow for temporary bonding of two dies and/or surfaces before a solder reflow operation binds the two surfaces permanently.

Figure 5:
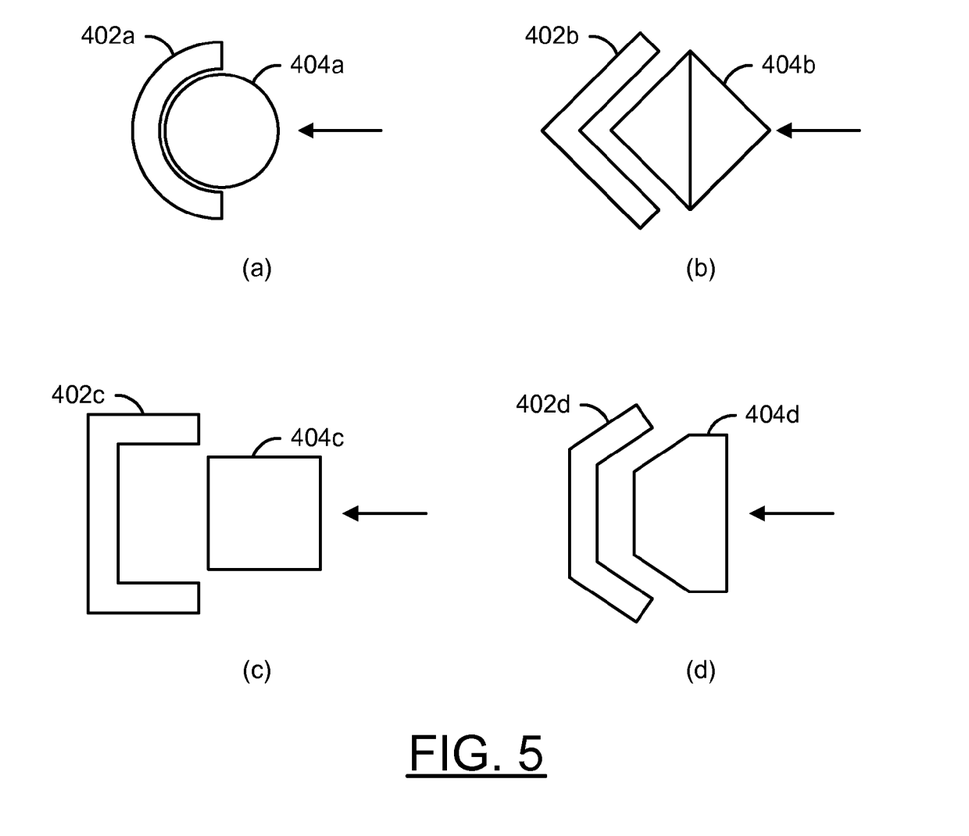
FIG. 5 is a diagram illustrating various features that may be used to facilitate alignment and bonding in accordance with yet another example embodiment of the present invention.

Referring to FIG. 5, a diagram is shown illustrating various features that may be used to facilitate alignment and bonding in accordance with yet another example embodiment of the present invention. The female interlocking structure (e.g., the hollow solder pillar 108 in FIG. 1) need not be complete. For example, an open semi circular pillar 402a and a solid pillar 404a may be implemented to allow for lateral sliding from one direction (e.g., indicated by the arrow) to aid in alignment of respective surfaces or substrates. Other shaped structures 402b-402d and 404b-404d may be implemented accordingly to enable alignment or movement of the pieces in the direction indicated by the arrow.

Figure 6:
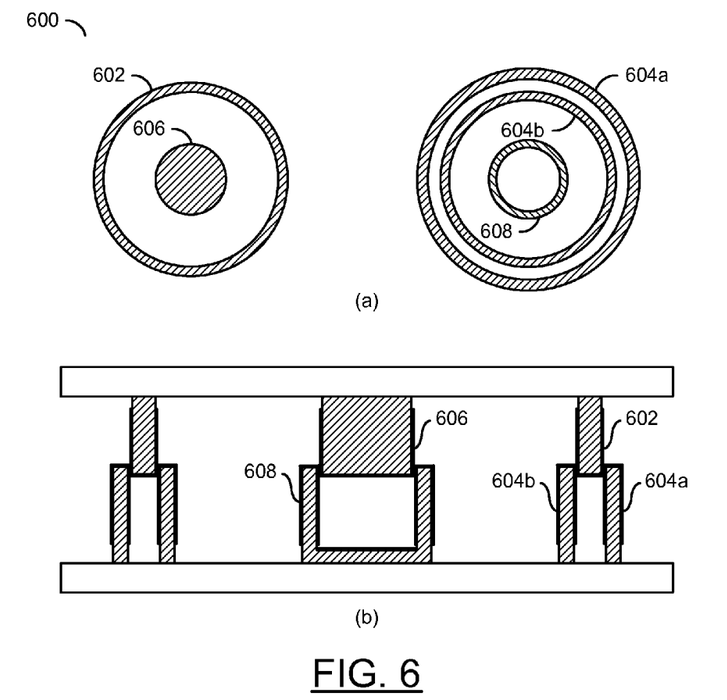
FIG. 6 is a diagram illustrating male and female coaxial features being used to facilitate alignment and bonding in accordance with still another example embodiment of the present invention.

Referring to FIG. 6, a diagram is shown illustrating a coaxial feature 600 in accordance with still another example embodiment of the present invention. A plan view (a) and a cross-section (b) of the coaxial connection 600 are shown. Similar shapes to those described above may be implemented for coaxial type connections. For example, a ground plane connection 602 may be implemented as an annular pipe type structure (e.g., hollow cylinder) on a device or on one substrate (or part) and an annular opening (e.g., two concentric pipes) 604a and 604b spaced apart on the mating substrate or part. A signal line 606 on the device, substrate, or part may be implemented as a solid cylinder, while on the mating substrate (or part) the signal line may be implemented as a hollow cylinder 608.

In one example, male and female coaxial features may be used to facilitate alignment and bonding in accordance with an example embodiment of the present invention. In one example, the ground signal or ground connections for a coaxial transmission line may be joined through appropriate sizing and spacing of metal and dielectric films. The ground plane connection on the device or on one part may be implemented as a ring type structure or large hollow cylinder 602, and the ground plane on the mating part may be implemented as an annular opening (two concentric spaced apart pipes) 604 that corresponds to the ring type solid structure 602. The signal line on the device or part may be implemented as a solid cylinder 606, while on the mating part the signal line may be implemented as a hollow cylinder 608 that matches the solid cylinder 606.

Various process flows and metallurgical variations may be used to fabricate interlocking features in accordance with embodiments of the present invention. In general, a device or structure may be created through conventional fabrication steps until metallization. When the device or structure is ready for metallization, one of three metallization process flows in accordance with embodiments of the present invention may be used. A first metallization process flow may comprise the following steps:

1. A uniform sputtered or evaporated TiW/Au, Ti/Pt/Ni—V, or other suitable metal stack may be deposited as a blanket structure (e.g., metal seedlayer) everywhere on the wafer/workpiece/substrate surface.
2. A positive/negative photoresist may be spun onto the wafer/workpiece/substrate to coat the surface evenly.
3. The positive/negative photoresist may undergo a soft bake, prior to imaging.
4. After exposure of the appropriate mask pattern (e.g., lithographic imaging), the resist may be developed.
5. The patterned wafer may be produced with cavities at selected locations where metal is to be plated. A rim (or edge) of the wafer/workpiece/substrate may have some sections cleared of the photoresist to enable electroplating contacts.
6. The wafers may be immersed in a electroplating bath, in order to deposit metal within the cavities.
7. The metal may be either gold, gold-tin alloy, or any other suitable solder material including, but not limited to Pb—Sn, Sn—Ag, In—Pb, In—Sn, SnAgCu, Au—Ge, Bismuth alloys, etc., of varying compositions. Varying compositions of the alloy may be obtained, for example, by successively plating different or alternate metals.

8. The photoresist may be stripped off the wafer surface with the use of suitable solvent or dry etch processes or a combination of processes.
9. The metal seedlayer deposited in step 1 may be etched off the wafer surface, thus isolating all the structures electrically.
10. The plated structures being much thicker are generally able to remain after the etch, and thus provide mechanical, as well as electrical connections to another substrate with which the plated structure may be aligned, and bonded.

A second metallization process flow may comprise the following steps:

1. A uniform sputtered or evaporated TiW/Au/Ti, or Ti/Pt/Ni—V or other suitable metal stack may be deposited as a blanket structure (e.g., metal seedlayer) everywhere on the wafer/workpiece/substrate surface.
2. A coating of SiN (PECVD) may be deposited on the entire wafer surface.
3. A positive/negative photoresist (e.g., SiN) may be spun on the wafer/workpiece/substrate to coat the surface evenly.
4. The positive/negative photoresist may undergo a soft bake, prior to imaging.
5. After exposure of the appropriate mask pattern (e.g., lithographic imaging), the photoresist may be developed and etched to produce openings.
6. The SiN in the photoresist openings may be etched either through dry plasma etching techniques or through wet chemical etching solutions to open the cavities to the metal surface underneath.
7. The patterned wafer may be produced with cavities at the selected locations where metal is to be plated. A rim (or edge) of the patterned wafer may have some sections cleared of the photoresist and the SiN to enable electroplating contacts.
8. The patterned wafers may be immersed in a electroplating bath, in order to deposit metal within the cavities.
9. The metal may be a thin gold deposition (<0.5 um) followed by a combination of base metals such as Nickel (1 to 2 um)/Majority-copper/1 to 2 um Nickel. The metal sandwich (e.g., Ni—Cu—Ni) generally produces a good combination of a metal structure that does not introduce diffusion or other undesirable alloying properties. Variation of the base metal stack may be possible by plating different or alternate metals.
10. The photoresist may be stripped off the wafer surface with the use of suitable solvent or dry etch processes or a combination thereof.
11. The exposed metal structure may now be further coated with gold or a solder to cover the entire structure with the solder for bonding or gold for passivation. A combination of gold, and then a solder may also be utilized.
12. The SiN may be etched off the wafer in a dry plasma etching system to remove the SiN from the field surface. A wet etch may also be utilized if appropriate.
13. The metal seedlayer deposited previously in step 1 may be etched off the wafer surface, thus isolating all the structures electrically.
14. The plated structures being much thicker are generally able to remain after the etch, and thus provide mechanical, as well as electrical connections to another substrate with which the plated structure may be aligned, and bonded.

In a third metallization process flow that is similar to the first flow, but with Electroless deposition to create structures similar in type to the second process flow, the following steps may be performed:

1. A uniform sputtered or evaporated TiW/Au/Ti, or Ti/Pt/Ni—V or suitable metal stack may be deposited as a blanket structure (or metal seedlayer) everywhere on the wafer/workpiece/substrate surface.
2. A positive/negative photoresist may be spun on the wafer/workpiece/substrate to coat the surface evenly.
3. The positive/negative photoresist may undergo a soft bake, prior to imaging.
4. After exposure of the appropriate mask pattern (e.g., lithographic imaging), the photoresist may be developed and etched.
5. The patterned wafer may be produced with cavities at the selected locations where metal is to be plated. The rim or edge of the patterned wafer may have some sections cleared of the photoresist as well.
6. The wafers may be immersed in a electroplating bath, in order to deposit the metal within the cavities.
7. The metal may be a thin gold deposition (e.g., <0.5 um) followed by a combination of base metals such as one to two microns of Nickel/Majority-Copper/one to two microns Nickel. The metal sandwich (e.g., Ni—Cu—Ni) generally produces a good combination of a metal structure that does not introduce diffusion or other undesirable alloying properties. Variation of the base metal stack may be possible by plating different or alternate metals.
8. The photoresist may then be stripped off the wafer surface with the use of a suitable solvent or dry etch processes or a combination thereof.
9. The exposed metal structure may be further coated with Electroless Ni, Pd, Au, Sn or other suitable Electroless alloys of cobalt, Ni, Molybdenum, Tungsten, or ternary alloys with Phosphorous or Boron such as CoP, CoB, CoWP, CoWB, NiMoP, NiWP, NiP, NiB, NiWB, NiMoB to cover the entire structure with the deposit.
10. The metal seedlayer deposited previously in step 1 may then be etched off the wafer surface, thus isolating all the structures electrically.
11. The plated structures being much thicker is generally able to remain after the etch, and thus provide mechanical, as well as electrical connections to another substrate with which the plated structure may be aligned, and bonded.

Figure 7:
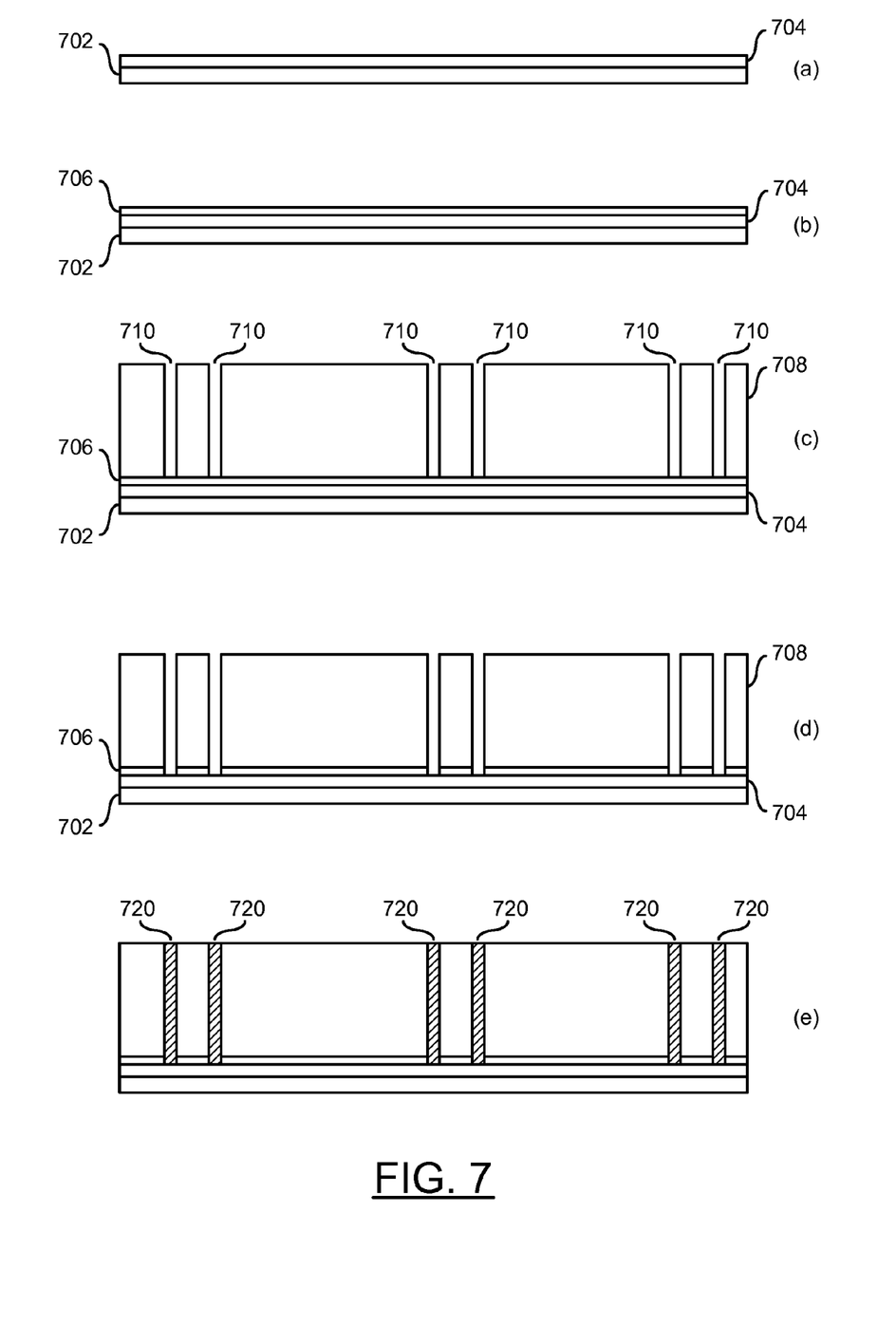
FIG. 7 is a diagram illustrating an example process flow that may be used to fabricate alignment features in accordance with embodiments of the present invention.

Referring to FIG. 7, a diagram is shown illustrating example steps in accordance with the second process flow described above. In a process flow stage (a), a substrate 702 may have a metal seedlayer 704 deposited thereon. The metal seedlayer 704 may comprise TiW/Au/Ti. In one example, the layer 704 may implement a 5 nm thin adhesion layer. In a process flow stage (b), a SiN layer 706 may be deposited on the layer 704. In one example, the layer 706 may comprise a 0.5 um PECVD SiN deposition. In a process flow stage (c), a photoresist layer 708 may be deposited on the layer 706, patterned (e.g., using photolithography, etc.), and etched to produce openings 710. In a process flow stage (d), openings in the SiN and Ti layer 706 may be produced (e.g., using dry etch or wet etch processes) to expose the Au or metal seedlayer 704.

In a process flow stage (e), plating of a metal, alloy or a combination thereof may be performed to produce structures 720. Several variations may be implemented. Variation 1: The plated metal structures 720 may be a Au/Ni/Cu/Ni stack of suitable thickness within the openings (cavities) 710. Variation 2: The plated metal structures 720 may be any base metal that may be plated (e.g., Copper, etc.). Variation 3: The plated metal may be a Au/Ni/Cu/Ni/Au stack. Variation 4: The plated metal structures 720 may comprise Au/Ni/Cu/Ni/Au—Sn. Variation 5: The plated alloy structures 720 may be Au/Au/Sn/Au/Sn/Au/Sn/Au/Sn alternating metal stacks. Variation 6: The structures 720 may be a directly plated alloy of Au—Sn from a single complexed bath. Variation 7: The plated alloy structures 720 may be another solder material including, but not limited to Pb—Sn, Sn—Ag, Sn—Ag—Cu, Sn—Cu, In—Sn, In—Pb, etc.

Figure 8:
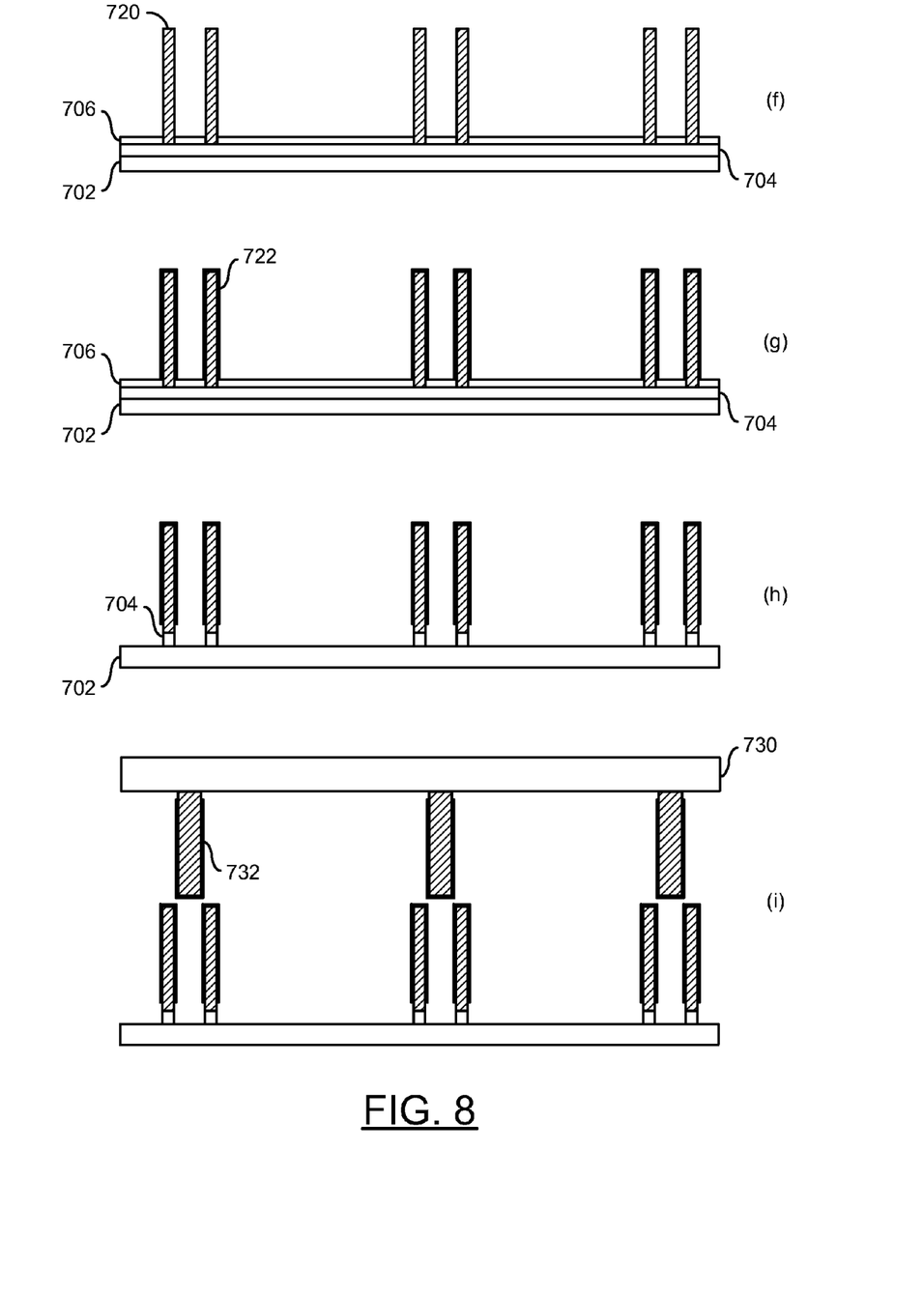
FIG. 8 is a diagram illustrating an example process flow that may be used to configure the features fabricated in FIG. 8 to facilitate a bonding operation in accordance with embodiments of the present invention.

Referring to FIG. 8, a diagram is shown further illustrating an example process flow that may be used to construct the features in accordance with embodiments of the present invention. In a process flow step (f), the photoresist layer 708 may be stripped, and the metal structures 720 left protruding above the wafer/workpiece/substrate surface. In a process flow step (g), an additional plating step may be performed to cover the exterior of the structures 720 with a plating material 722. The process flow step (g) generally provides an opportunity to utilize a different metal combination or alloy combination on only the outer surfaces of the structures 720, thus covering the core pillar or structure to provide a good bonding/mating surface. A number of variations may be implemented. Variation 1: the coating 722 may be implemented as a metal such as Ni/Au. Variation 2: the coating 722 may be implemented as Ni/Au/Sn/Au/Sn/Au/Sn/Au . . . alternating coatings to form a solder skin on the structure 720. Variation 3: the coating 722 may be implemented with any suitable solder metal, or metal alloys. Variation 4: the coating 722 may be implemented as a suitable or functional metal of any kind depending on the application.

Once the desired coating 722 has been applied, a SiN etching step may be performed. The SiN etching may be accomplished through either a dry plasma based process or a wet etch process to remove the SiN, and any Ti, to expose the underlying gold layer. Following the SiN etching step, a metal seedlayer (e.g., Au/TiW) etching step may be performed. The Au/TiW metal seedlayers may be etched to remove the metal from the field, and to ensure all the electrical structures are isolated. The resulting structure is shown generally in process flow step (h). A similar structure for the interlocking male structure may be created using a similar process flow. The two structures may then be bonded together through a solder reflow process for joining a device to another device or a board (as illustrated in (i)).

Figure 9:
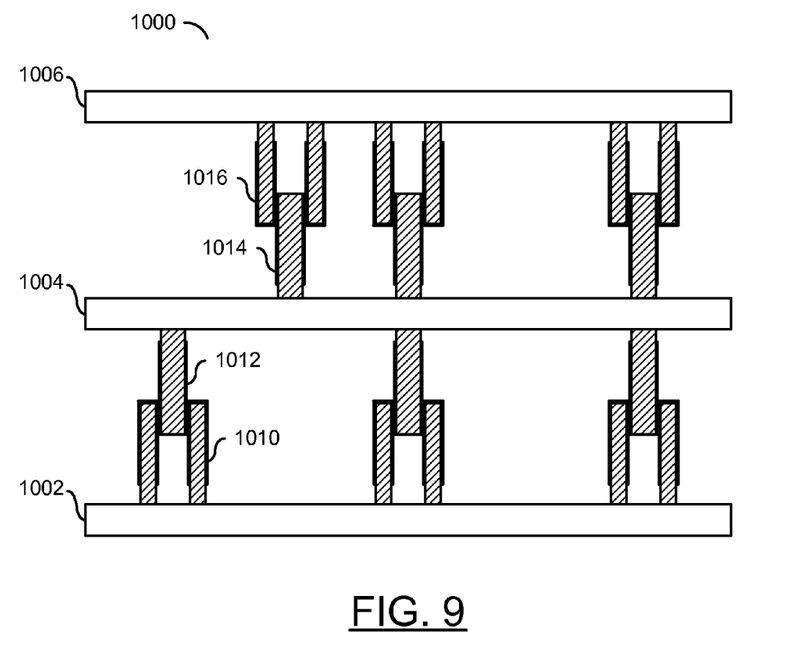
FIG. 9 is a diagram illustrating bonding of a stack of three substrates using features in accordance with an embodiment of the present invention.

Referring to FIG. 9, a diagram is shown illustrating an example of bonding a stack of three substrates vertically one on top of another using features in accordance with an embodiment of the present invention. In one example, a stack of substrates 1000 may comprise a substrate 1002, a substrate 1004 and a substrate 1006. The substrate 1002 may include a feature 1010. The substrate 1004 may include a feature 1012 on a first (bottom) surface that may be configured to mate with the feature 1010 of the substrate 1002. The substrate 1004 may also comprise a feature 1014 on a second (top) surface that may be configured to mate with a feature 1016 on a surface of the substrate 1006. In general, the features 1010, 1012, 1014 and 1016 may be configured such that the substrates 1002, 1004 and 1006 are self-aligning when the features engage and held together securely during a single solder reflow operation bonding the substrates together permanently.

Figure 10:
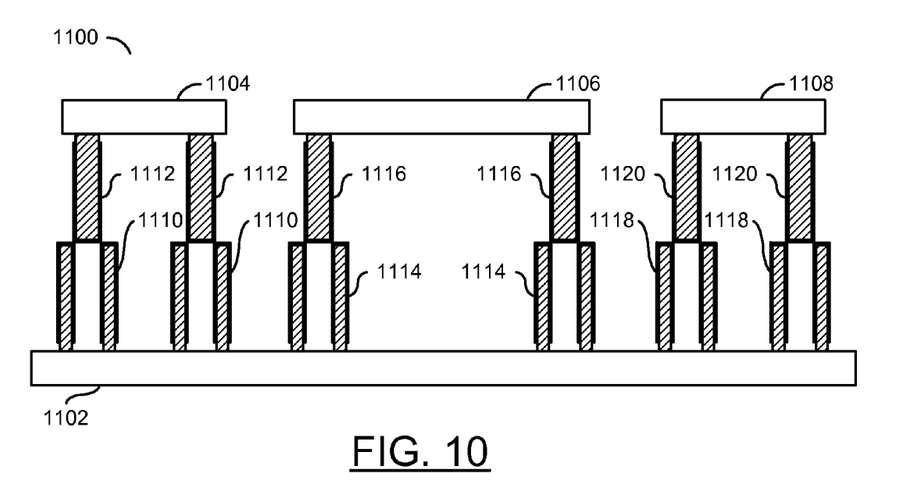
FIG. 10 is a diagram illustrating the attachment of two or more dies or substrates onto a larger substrate using features in accordance with another embodiment of the present invention.

Referring to FIG. 10, a diagram is shown illustrating bonding three or more substrates (or devices) to a single substrate with the same solder reflow operation by using features implemented in accordance with an embodiment of the present invention. A part 1100 may comprise a substrate (or device) 1102, a substrate (or device) 1104, a substrate (or device) 1106 and a substrate (or device) 1108. The substrate 1104 may be assembled to the substrate 1102 by mating features 1110 and 1112. The substrate 1106 may be mated to the substrate 1102 by mating features 1114 and 1116. The substrate 1108 may be mated to the substrate 1102 by mating features 1118 and 1120. All the parts may be assembled and then thermally bonded through a single solder reflow operation. The mating features 1110-1120 generally align the various substrates and hold the substrates together during the reflow operation.

Figure 11:
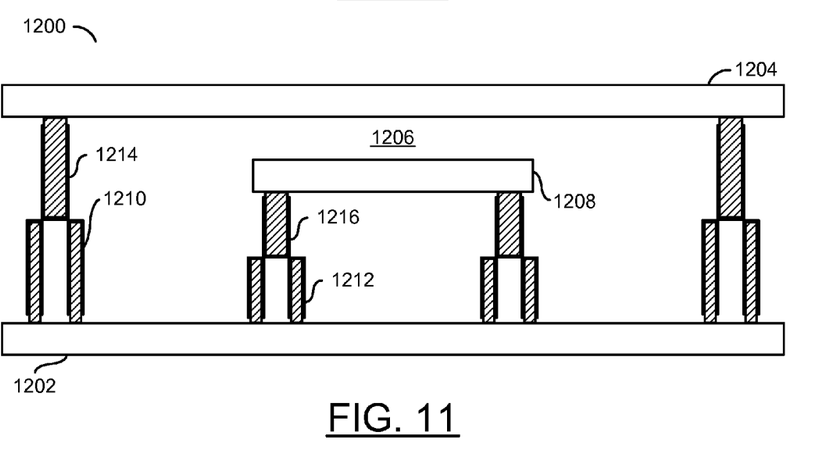
FIG. 11 is a diagram illustrating bonding of a die or substrate within a cavity formed by two substrates using features in accordance with yet another embodiment of the present invention.

Referring to FIG. 11, a stack 1200 is shown illustrating an application involving different size features in accordance with another embodiment of the present invention. In one example, a part may be bonded between two substrates to form a hermetically sealed cavity having the part disposed within. For example, a substrate 1202 and a substrate 1204 may have mating features configured to form a hermetically sealed cavity 1206 enclosing a substrate (or device) 1208. In one example, the substrate 1202 may include features 1210 having a first height and features 1212 having a second height, smaller than the first height. The features 1210 may be configured to mate with a feature 1214 of the substrate 1204 and the feature 1212 may be configured to mate with a feature 1216 of the part or substrate 1208. The features 1212 and 1214 are generally sized to facilitate mounting of the part or substrate 1208 within the cavity 1206.

Embodiments of the present invention generally provide one or more metallized features (or structures) on a surface/substrate that may be mated to a one or more metallized features (or structures) of appropriate dimensions on another surface/substrate. The features on the two surfaces/substrates generally facilitate alignment and bonding of the two surfaces/substrates. In one example, a die/substrate in a top position may be lowered onto a substrate/die in a bottom position by visual pattern alignment. During a solder reflow operation the two metalized structures may be melted, allowing either a slight applied pressure to push or surface tension to pull the structures together as a male feature is trapped within a female feature. The features implemented in accordance with embodiments of the present invention generally minimize alignment problems, while retaining interconnections that ensure RF and milliwave/microwave signal integrity.

The structures (or features) in accordance with embodiments of the present invention generally provide a technique to align structures elsewhere on a substrate, and bind two or more parts temporarily to allow transfer of the parts to a bonding system/station for completing the bonding. With solder bonding, the features may be configured such that the solder reflow provides a bridging gap to the lateral dimension, and helps provide the extra volumetric space to capture the excess solder from compression of the parts. The bonded (e.g., reflowed solder) assembly generally shows good alignment, and any gaps between the counterpart (interlocking) features may, for example, be filled with molten solder during reflow, by applying slight pressure to the substrates during reflow. The solder may be graded along the depth of the interlocking features to meet the design criteria of a particular implementation.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first substrate having a first surface, said first surface having disposed thereon a first feature, wherein said first feature (i) extends above said first surface and (ii) comprises a metal seedlayer on said first surface and a metal stack on said metal seedlayer; and
   a second substrate having a second surface, said second surface having disposed thereon a second feature, wherein
   (a) said second feature (i) extends above said second surface and (ii) comprises a metal seedlayer on said second surface and a metal stack on said metal seedlayer, and
   (b) said first feature is configured to interlock with said second feature when said first feature is in direct contact with said second feature, such that said first substrate and said second substrate are aligned by said first and said second features within a predefined accuracy.

2. The apparatus according to claim 1, wherein each of said first substrate and said second substrate comprise a structure selected from the group consisting of a circuit board, a wafer, a die, and a device.

3. The apparatus according to claim 1, wherein said second feature defines a void extending above said second surface into which said first feature fits.

4. The apparatus according to claim 3, wherein said first feature fits within said second feature tightly enough to hold said first substrate and said second substrate together during a bonding operation.

5. The apparatus according to claim 4, wherein at least one of said first feature and said second feature comprises a serrated spline.

6. The apparatus according to claim 1, wherein said first feature and said second feature provide said alignment in response to a vertical force being applied to at least one of said substrates.

7. The apparatus according to claim 1, wherein said first feature and said second feature provide said alignment in response to a horizontal force being applied to at least one of said substrates.

8. The apparatus according to claim 1, wherein said first surface, said second surface, said first feature, and said second feature form an enclosed cavity when said first and said second features are interlocked.

9. The apparatus according to claim 1, wherein said first feature and said second feature are coated with a plating material to form a solid mechanical bond during a solder reflow operation.

10. The apparatus according to claim 1 wherein:
    said first substrate has disposed thereon a plurality of said first features; and
    said second substrate has disposed thereon a plurality of said second features, wherein said plurality of said second features are complements of said plurality of said first features.

11. A method of aligning two or more substrates, said method comprising the steps of:
    forming a first feature on a first surface of a first substrate using a photolithographic process, wherein said first feature extends above said first surface and comprises a metal seedlayer on said first surface and a metal stack on said metal seedlayer; and
    forming a second feature on a second surface of said second substrate using a photolithographic process, wherein (i) said second feature extends above said second surface and comprises a metal seedlayer on said second surface and a metal stack on said metal seedlayer, and (ii) said first feature is configured to interlock with said second feature when said first feature is in direct contact with said second feature, such that said first substrate and said second substrate are aligned by said first and said second features within a predefined accuracy.

12. The method according to claim 11, wherein each of said first substrate and said second substrate comprise a structure selected from the group consisting of a circuit board, a wafer, a die, and a device.

13. The method according to claim 11, wherein said second feature defines a void extending above said second surface into which said first feature fits.

14. The method according to claim 13, wherein an outer surface of said first feature and an outer surface of said second feature are coated with a plating material such that said first feature fits within said second feature tightly enough to hold said first substrate and said second substrate together during a bonding operation.

15. The method according to claim 14, wherein at least one of said first feature and said second feature comprises a serrated spline.

16. The method according to claim 11, further comprising applying a vertical force to at least one of said first and said second substrates wherein said first feature and said second feature provide said alignment in response to the vertical force.

17. The method according to claim 11, further comprising applying a horizontal force to at least one of said first and said second substrates wherein said first feature and said second feature provide said alignment in response to the horizontal force.

18. The method according to claim 11, wherein said first feature, said first surface, said second surface, and said second feature form an enclosed cavity when said first and said second features are interlocked.

19. The method according to claim 18, wherein said first feature and said second feature are configured to hermetically seal said enclosed cavity.

20. The method according to claim 11, further comprising aligning and bonding one or more additional substrates to said first substrate using additional features formed on said first substrate and said one or more additional substrates.

* * * * *